United States Patent [19]

Akiba et al.

[11] Patent Number: 4,549,042

[45] Date of Patent: Oct. 22, 1985

[54] LITZ WIRE FOR DEGREASING SKIN EFFECT AT HIGH FREQUENCY

[75] Inventors: Yutaka Akiba, Fujisawa; Kazuo Hirota, Yokohama, both of Japan

[73] Assignee: Hitachi, Ltd., Tokyo, Japan

[21] Appl. No.: 404,567

[22] Filed: Aug. 2, 1982

[30] Foreign Application Priority Data

Jul. 31, 1981 [JP] Japan ................................ 56-119051

[51] Int. Cl.[4] ......................... H01B 7/30; G01R 33/02

[52] U.S. Cl. ............................ 174/114 R; 174/113 C; 174/115; 324/260; 336/223

[58] Field of Search ............... 324/210, 127, 228, 234, 324/236, 244, 248, 249, 256, 262; 376/108; 174/128 S, 128 R, 128 BL, 33, 39, 113 C, 114 R, 115; 73/146.5, 861.17, 861.14; 333/236; 219/67, 10.49 R, 10.71, 10.57; 57/263; 363/96, 135, 139; 336/223

[56] References Cited

U.S. PATENT DOCUMENTS

Re. 28,989 10/1976 Cushing ....................... 73/861.17 X
2,797,392 6/1957 Closston ............................. 333/236
3,293,009 12/1966 Allen et al. ....................... 174/128 S
3,806,326 4/1974 Medrick et al. ............ 174/128 R X
3,899,651 8/1975 Bowman et al. ...................... 219/67
4,067,235 1/1978 Markland ........................... 73/146.5
4,079,192 3/1978 Josse ................................ 174/36 X
4,176,905 12/1979 Marechal .................... 174/128 R X
4,195,199 3/1980 Hillmann et al. ................ 174/128 S
4,317,979 3/1982 Frank et al. .................... 324/127 X
4,327,244 4/1982 Horvath et al. ............. 174/128 S X
4,360,775 11/1982 Mauduit et al. ..................... 324/210
4,457,205 7/1984 Ross ............................... 376/108 X

*Primary Examiner*—Gerard R. Strecker
*Assistant Examiner*—Warren S. Edmonds
*Attorney, Agent, or Firm*—Antonelli, Terry & Wands

[57] ABSTRACT

A litz wire comprises three or more insulated strands consisting essentially of an inner conductor and an outer insulating layer on said conductor. The strands are twisted symmetrically with respect to the center line of the wire, so that a current density distribution in the litz wire becomes uniform. Three or more such litz wires are twisted to form a composite litz wire. The composite litz wires are suitable for use in a high-frequency coil.

13 Claims, 27 Drawing Figures

LITZ WIRE FOR DECREASING SKIN EFFECT AT HIGH FREQUENCY

BACKGROUND OF THE INVENTION

1. Field of the Invention

The present invention relates to a litz wire and a coil for a high frequency application.

2. Description of the Prior Art

Generally, when a high frequency current flows through a conductor, there occurs a phenomenon that the high frequency current is limited to a surface of the conductor and does not enter the interior of the conductor. This phenomenon is called the "skin effect". Since the high frequency current flows through only the surface portion of the conductor, the effective resistance of the conductor is increased. The above-mentioned increase in the effective resistance is remarkable when the diameter of the conductor is nearly equal to or greater than the skin depth. In order to avoid such an increase in effective resistance, a ribbon-like conductor is used, or thin insulated wires are twisted into a wire bundle so that the high frequency current is distributed uniformly at the cross section of the wire bundle. Such a wire bundle is called the "litz wire".

On the other hand, a magnetic bubble memory includes a high frequency current coil. The magnetic bubble memory is provided with a rotating magnetic field-generating circuit for transferring bubble domains, and the coil is used as a constituent element of the rotating field generating circuit. As is well-known, the rotating field is generated by arranging a plurality of coils, for example, two coils so that magnetic fields generated by the coils perpendicularly intersect each other, and by causing currents having a $\pi/2$ phase difference with respect to each other to flow through the coils. These coils are usually driven at a frequency of 50 to 100 kHz.

In order to write in and read out data at high speed in the above-mentioned magnetic bubble memory by the increasing requirement of mass memory, it is required to drive the coils at higher frequencies. Accordingly it is necessary to take measures sufficient to solve the problems with respect to the skin effect.

A conventional litz wire is formed in such a manner that seven elementary solid wires (hereinafter referred to as "strands") are employed and that six strands are twisted around one strand (that is, concentric twisting is performed), in order for the circumference of the completed wire to have a circular form. In other words, the strand disposed on the center line of the litz wire is extended substantially in the form of a straight line, and six surrounding strands are helically twisted so as to enclose the center strand.

Now, let us consider the skin effect in a litz wire. The skin effect at each strand is affected not only by a magnetic field due to its own current but also by a magnetic field due to a current flowing through adjacent strands. As a result, in the conventional litz wire, the six surrounding strands are approximately equal in current density to each other, since these strands are arranged alike in the litz wire. However, the strand disposed on the center is strongly affected by the skin effect as compared with the surrounding strands, and is smaller in current density than the surrounding strands. In other words, since the seven strands are unequal in arrangement, the current density distribution of each of the strands is not uniform, and thus the loss resistance of the litz wire is increased.

As mentioned above, the current density of each strand is not constant in the conventional litz wire of concentric twisting. Therefore, the conventional litz wire fails to completely solve the problems with respect to the skin effect.

SUMMARY OF THE INVENTION

An object of the present invention is to provide a litz wire and a coil with a uniform current density distribution and with lower loss resistance due to the skin effect in order to enable a high frequency current to flow through the litz wire or coil and to drive a magnetic bubble memory at a high speed.

Another object of the present invention is to provide a litz wire having a uniform current density distribution and to use the resultant space for introducing a control signal line for detecting the temperature or magnetic field of the litz wire so as to control the litz wire or coil.

A characteristic feature of the present invention is to twist m strands into a fundamental unit litz wire in such a manner that the strands are arranged alike in the fundamental unit litz wire where m is an integer equal to or greater than 3, to further twist n fundamental unit litz wires and repeat alike twistings N times, if necessary, to form a final litz wire twisted N-fold where n is an integer equal to or greater than 3 and N is an integer equal to or greater than 2, and to form a coil by the use of the fundamental unit litz wire or the above litz wire.

BRIEF DESCRIPTION OF THE DRAWINGS

FIG. 1A is a perspective view showing the exterior of the conventional litz wire, FIG. 1B is a sectional view taken along the line IB—IB of FIG. 1A, and FIG. 1C is a sectional view showing one of the strands making up a litz wire shown in FIG. 1B.

DESCRIPTION OF THE PREFERRED EMBODIMENTS

Prior to the detailed explanation of the present invention, a conventional litz wire will be explained with reference to FIGS. 1A to 1C.

Figure 1A:
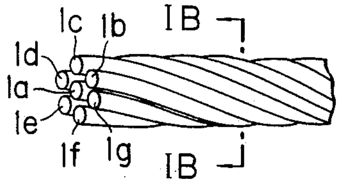
FIG. 1A PRIOR ART
FIGS. 1A to 1C show a conventional litz wire.
Figure 1B:
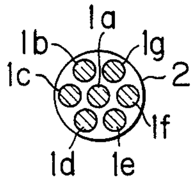
FIG. 1B PRIOR ART
Figure 1C:
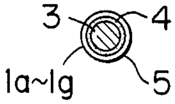
FIG. 1C PRIOR ART

FIG. 1A is a perspective view showing a conventional litz wire. Referring to FIG. 1A, seven strands 1*a* to 1*g* are twisted to form a completed wire. FIG. 1B is a sectional view taken along the line IB—IB of FIG. 1A, and shows that the circumference of the completed wire shown in FIG. 1A is approximately equal to a circle. As mentioned previously, the strand 1*a* disposed on the center line of the completed wire is smaller in current density than the surrounding strands 1*b* to 1*g*. That is, the current density distribution at the completed wire is not uniform, and therefore the loss resistance is increased. FIG. 1C is a sectional view of each of the strands 1*a* to 1*g*. Each strand is a self-bonded magnet wire requiring no coil varnish. In more detail, in each strand, the circumference of a copper wire 3 is covered with an insulating layer 4 of polyurethane, and the circumference of the insulating layer 4 is coated with an adhesive layer 5 of thermosetting resin.

Next, the present invention will be explained in detail, by the use of the first embodiments shown in FIGS. 2A to 2F.

FIGS. 2A to 2F are sectional views showing six embodiments of a fundamental unit litz wire according to the present invention. As can be seen from FIGS. 2A to 2F, the most important feature of a litz wire according to the present invention resides in that m strands, where m is an integer equal to or greater than 3, for forming the litz wire are twisted so that they are arranged symmetrically with respect to the center line, that is, they are arranged alike or concentrically in the litz wire, to have the same current density in all of the strands.

Figure 2A:
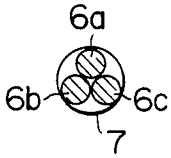
FIGS. 2A to 2F are sectional views showing six embodiments of a fundamental unit litz wire according to the present invention.

FIG. 2A shows a litz wire made by twisting three strands 6*a* to 6*c*, and reference numeral 7 in FIG. 2A designates the circumference of the completed litz wire. The three strands 6*a* to 6*c* are twisted equally, and therefore the completed litz wire has a symmetrical structure.

Figure 2B:
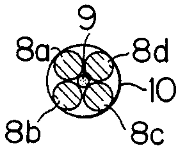
Figure 2C:
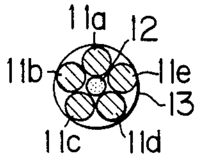
Figure 2D:
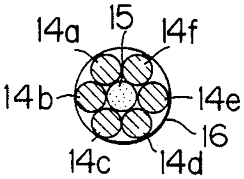
Figure 2E:
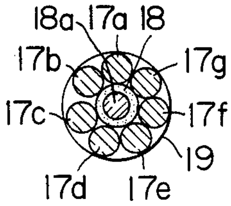
Figure 2F:
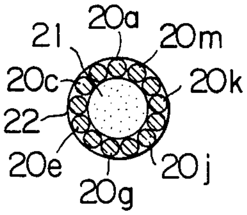

FIG. 2B shows a litz wire made by twisting four strands 8*a* to 8*d*, FIG. 2C shows a litz wire made by twisting five strands 11*a* to 11*e*, FIG. 2D shows a litz wire made by twisting six strands 14*a* to 14*f*, FIG. 2E shows a litz wire made by twisting seven strands 17*a* to 17*g*, and FIG. 2F shows a litz wire made by twisting thirteen strands 20*a* to 20*m*. In FIGS. 2B to 2F, reference numerals 10, 13, 16, 19 and 22 designate the circumferences of the completed litz wires. These litz wires are formed of a plurality of strands twisted around one of axial members 9, 12, 15, 18 and 21, which are provided with a thermoplastic resin layer at their circumference and are flexible. Accordingly, as shown in FIGS. 2B to 2F, strands are arranged radially with respect to each of the axial members 9, 12, 15, 18 and 21, or arranged alike in a litz wire. Further, the strands are made adhere to the axial members 9, 12, 15, 18 and 21.

As mentioned above, each of these axial members forms an axial core when the strands are twisted. The diameter of the axial member is determined in accordance with the number and diameter of surrounding strands. Since the strands are kept in contact with and bonded to the axial member, the axial member has a function of preventing the litz wire from getting out of its shape. The axial member is usually made of an insulating material. However, when the axial member is formed of an insulated wire whose central portion is a conductor, the conductor can be used as a control signal line, as will be explained later.

Now, power loss in a conductor will be calculated for the case where a current density distribution is generated in the conductor due to the skin effect, to clarify the relation between the current density distribution and the high frequency resistance of the conductor.

Figure 3:
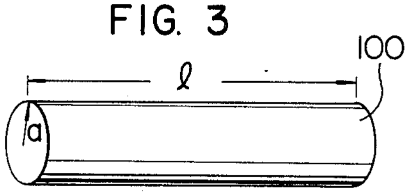
FIG. 3 is a perspective view showing a solid wire.
Figure 4:
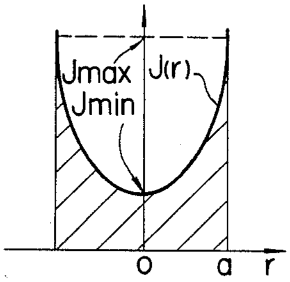
FIG. 4 is a graph showing a current density distribution at a solid wire.

First, let us consider the case where a current flows in a conductor 100 of FIG. 3 with a current distribution J(r) of FIG. 4. When the radius, length, conductivity, resistivity and magnetic permeability of the conductor 100 are expressed by a, l, $\sigma$, $\rho$ and $\mu$, respectively, the current density distribution J(r) and skin depth $\delta$ in the conductor are given by the following equations:

$$J(r) = J_{max} e^{\frac{r-a}{\delta}}. \tag{1}$$

$$\delta = \sqrt{\frac{2}{\omega\sigma\mu}} \tag{2}$$

where $J_{max}$ and $\omega$indicate a maximum current density and an angular frequency, respectively.

The total current I flowing through the conductor is given by the following equation:

$$I = \int_0^a 2\pi r J(r) dr \tag{3}$$

That is, the maximum current density $J_{max}$ is given by the following equation:

$$J_{max} = \frac{e^{\frac{a}{\delta}} \cdot I}{2\pi\delta\left\{ a e^{\frac{a}{\delta}} - \delta\left( e^{\frac{a}{\delta}} - 1 \right) \right\}} \tag{4}$$

Accordingly, a power loss P $(=R(r, \theta)\cdot\iota^2(r, \theta)\cdot l)$ generated when the current I flows through the conductor 100 shown in FIG. 3, is given by the following equation:

$$\begin{aligned} \underline{P} &= \int_0^{2\pi} \int_0^a \rho l J^2(r) r d\theta dr \\ &= 2\pi\rho l J_{max}^2 e^{\frac{-2a}{\delta}} \int_0^a r e^{\frac{2r}{\delta}} dr \\ &= \frac{\rho l I^2 \left\{ a e^{\frac{2a}{\delta}} - \frac{\delta}{2}\left( e^{\frac{2a}{\delta}} - 1 \right) \right\}}{4\pi\delta\left\{ a e^{\frac{a}{\delta}} - \delta\left( e^{\frac{a}{\delta}} - 1 \right) \right\}^2} \end{aligned} \tag{5}$$

On the other hand, a power loss $P_o$ generated when a current I having a uniform current density flows through the conductor 100 shown in FIG. 3, is given by the following equation:

$$P_o = R_o I^2 = \rho \frac{l}{\pi a^2} I^2 \tag{6}$$

Let us define a parameter t by the following equation:

$$t = \frac{a}{\delta} \quad (7)$$

Then, the ratio of the two power losses P and $P_o$ is given by the following equation:

$$\frac{P(t)}{P_o} = \frac{t^2(2t - 1 + e^{-2t})}{8(t - 1 + e^{-t})^2} \quad (8)$$

The ratio of the high frequency resistance R to uniform current resistance $R_o$ is expressed by the following equation:

$$\frac{R}{R_o} = \frac{RI^2}{R_oI^2} = \frac{P(t)}{P_o} \quad (9)$$

Accordingly, the ratio $R/R_o$ is given by the following equation:

$$\frac{R(t)}{R_o} = \frac{t^2(2t - 1 + e^{-2t})}{8(t - 1 + e^{-t})^2} \quad (10)$$

When R(t) is calculated from Equation (10) for t=0, that is, in the case where ω approaches zero, we can find the following relation:

$$R(O) = \lim_{t \to o} R(t) = R_o \quad (11)$$

Now, let us consider the case where the parameter t satisfies the following relation:

$$t >> 1 \quad (12)$$

In this case, the ratio $R(t)/R_o$ is given by the following formula:

$$\frac{R(t)}{R_o} \approx \frac{t}{4} \quad (13)$$

Figure 5:
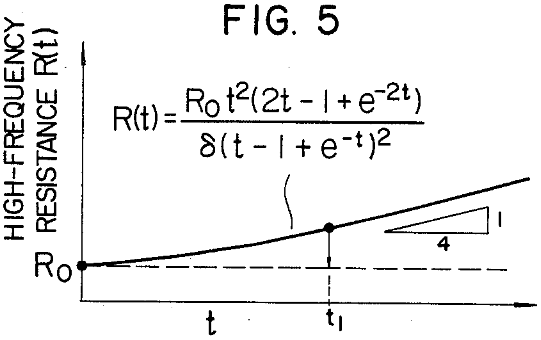
FIG. 5 is a graph showing the dependence of a high frequency resistance R(t) on a parameter t.

FIG. 5 shows the high frequency resistance R(t) given by Equation (10). As can be seen from FIG. 5, the high frequency resistance is increased with the radius a of the conductor 100 exceeding the skin depth δ.

Further, let us consider a ratio $J_{max}/J_{min}$ to show a current density distribution. From Equations (1) and (7), we can obtain the following equation:

$$\frac{J_{max}}{J_{min}} = e^t \quad (14)$$

Figure 6:
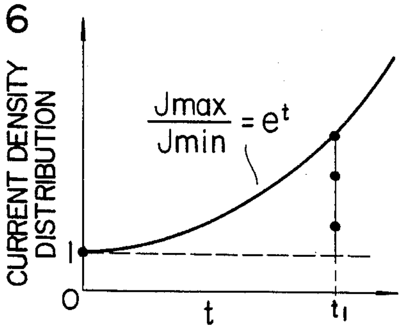
FIG. 6 is a graph showing current density distributions in terms of a ratio $J_{max}/J_{min}$.

FIG. 6 shows the ratio $J_{max}/J_{min}$:

With no skin effect, a current density distribution is uniform and the parameter t in Equation (14) is equal to zero and therefore $J_{max}=J_{min}$.

As can be seen from FIGS. 5 and 6, the high frequency resistance R(t) is increased with the ratio $J_{max}/J_{min}$ corresponding to a current density distribution.

Accordingly, when a current I having a uniform current density (that is, $J_{max}=J_{min}$) flows through the conductor, the high frequency resistance of the conductor takes a minimum value $R_o$. For example, when a solid wire having a parameter $t_1$ ($\omega_1$, $a_1$) shown in FIG. 6 is replaced by a litz wire having the same parameter, the ratio $J_{max}/J_{min}$ may theoretically be 1. Accordingly, the high frequency resistance R can be the minimum value $R_o$.

Figure 7:
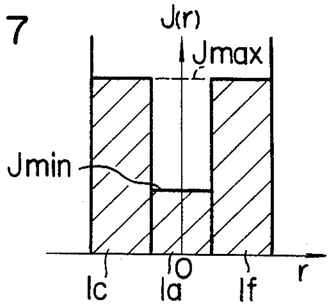
FIG. 7 is a graph showing a current density distribution at a conventional litz wire.

However, the above-mentioned argument assumes that the same current flows through each of strands making up a litz wire. As mentioned previously, the current flowing through the litz wire shown in FIG. 1B is not uniform. In more detail, a current density distribution at a section of the litz wire taken along the line IB—IB has such a form as shown in FIG. 7. That is, each of the strands fails to obtain the same current density.

On the other hand, in the embodiments of a litz wire according to the present invention which are shown in FIGS. 2A to 2F, strands for forming a litz wire are arranged symmetrically with respect to a center line. The same current density is thus obtained in all of the strands, and the high frequency resistance R of the litz wire is equal to the minimum value $R_o$.

Figure 8A:
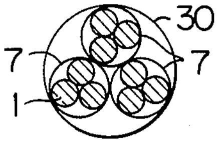
FIGS. 8A to 8D are sectional views showing four embodiments of a litz wire which is made by twisting fundamental unit litz wires shown in one of FIGS. 2A to 2F.
Figure 8B:
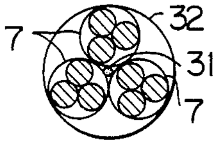
Figure 8C:
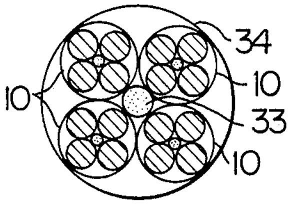
Figure 8D:
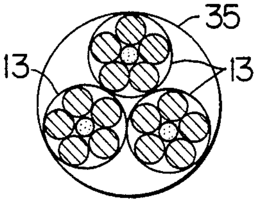

FIGS. 8A to 8D show embodiments of the present invention which are made by twisting n fundamental unit litz wires where n is an integer equal to or greater than 3. FIG. 8A shows a litz wire made by twisting three unit litz wires each shown in FIG. 2A, and FIG. 8B shows a litz wire obtained by placing an axial member 31 along the center line of the litz wire shown in FIG. 8A. The circumference of the litz wires shown in FIGS. 8A and 8B is indicated by reference numerals 30 and 32. Further, FIG. 8C shows a litz wire made by twisting four fundamental unit litz wires, each of which is shown in FIG. 2B, around an axial member 33. FIG. 8D shows a litz wire made by twisting three fundamental unit litz wires each shown in FIG. 2C.

Figure 9A:
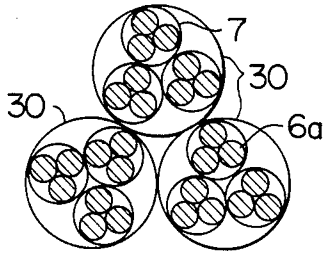
FIGS. 9A to 9D are sectional views showing four embodiments of a litz wire which is made by further twisting litz wires shown in one of FIGS. 8A to 8D.
Figure 9B:
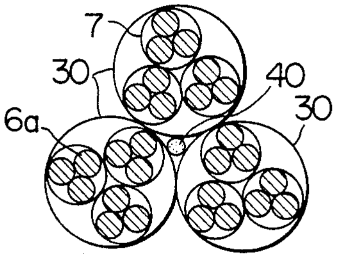
Figure 9C:
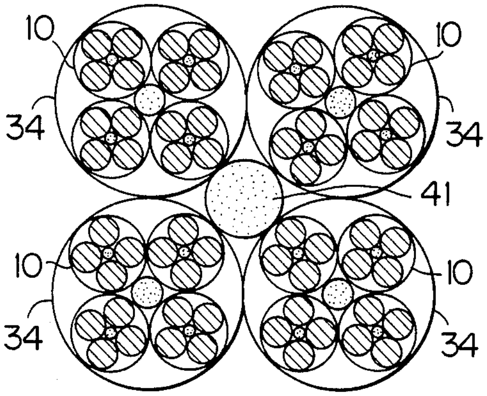
Figure 9D:
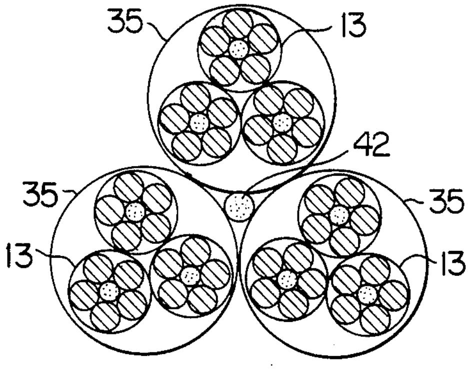

FIGS. 9A to 9D show embodiments of the present invention which are made by twisting p litz wires each shown in any one of FIGS. 8A to 8D where p is an integer equal to or greater than 3. FIG. 9A shows a litz wire made by twisting three litz wires, each of which is shown in FIG. 8A. FIG. 9B shows a litz wire obtained by placing an axial member 40 along the center line of the litz wire shown in FIG. 9A. FIG. 9C shows a litz wire made by twisting four litz wires, each of which is shown in FIG. 8C, around an axial member 41. FIG. 9D shows a litz wire which is made by twisting three litz wires each shown in FIG. 8D, and which includes an axial member 42 along the center line. While the circumference of each of the above embodiments is not shown in FIGS. 9A to 9D, it is evident that the circumference of each embodiment has the form of a circle.

FIGS. 8A to 8D show four litz wires of composite twisting, and FIGS. 9A to 9D show four other litz wires of composite twisting. However, the litz wire of composite twisting is not limited to the abovementioned eight litz wires, but various kinds of composite twisting can be made using a plurality of litz wires including the same strand, by reference to the structures of the fundamental unit litz wires shown in FIGS. 2A to 2F.

Since a litz wire according to the present invention is put in such a twisted state as mentioned above, strands making up the litz wire are equal in structural arrangement to each other. As a result, all of the strands are similar, with respect to the influence of adjacent strands on the skin effect at a strand, and thus currents of the same value flow through the strands. Accordingly, a current density distribution is uniform in all of the strands. That is, the current density in each strand is not affected by the skin effect from adjacent strands but affected only by the skin effect due to its own current. Thus, in the present invention, only the skin effect of each strand has an influence on a current flowing through the litz wire. Accordingly, the loss resistance of the litz wire is greatly reduced as compared with that of the conventional litz wire.

Figure 10:
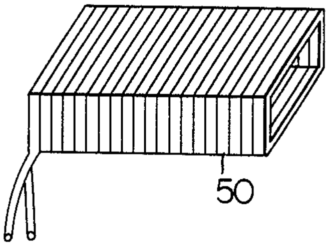
FIG. 10 is a perspective view showing a coil formed of a litz wire according to the present invention.
Figure 11:
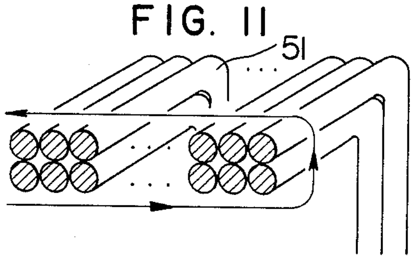
FIG. 11 is a perspective view, partly in cross section, of a double-layer coil.

FIG. 10 shows an embodiment of a coil 50 which is formed of such a litz wire as mentioned above, and FIG. 11 is a perspective view, partly in cross section, of a main part of a double-layer coil 51 which is formed of a litz wire. In FIG. 11, an arrow indicates the direction of coil winding.

Next, the effect of the present invention will be explained, with reference to the drawings.

Figure 12:
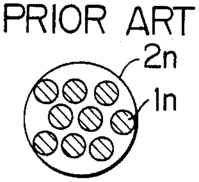
FIG. 12 PRIOR ART
FIG. 12 is a sectional view of a conventional litz wire whose characteristic is compared with the characteristic of a litz wire according to the present invention.

FIG. 12 is a sectional view of a conventional litz wire whose characteristic is compared with the characteristic of a litz wire according to the present invention. Referring to FIG. 12, nine strands 1*n* each having an effective cross sectional area S are twisted to form a litz wire, and the circumference of the completed litz wire is indicated by reference character 2*n*.

Figure 13:
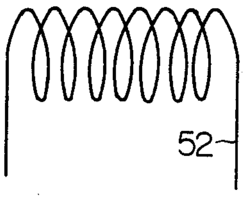
FIG. 13 is a view showing the form of a coil.

FIG. 13 is an elevational view of a coil 52 which is used to compare the characteristic of a conventional litz wire with that of a litz wire according to the present invention.

Figure 14:
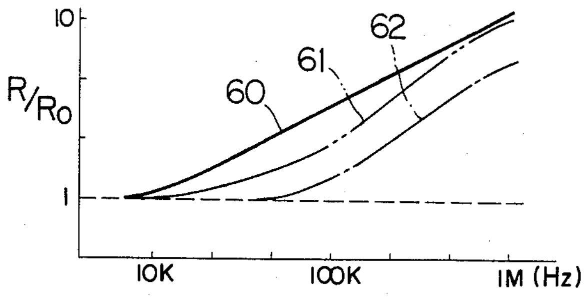
FIG. 14 is a graph showing a ratio $R/R_o$ of high frequency to d.c. resistance versus frequency f.

FIG. 14 shows the frequency characteristic of loss resistance at various coils, to compare the present invention with the prior art.

Curves shown in FIG. 14 correspond to conductors described in the following Table 1.

TABLE 1

| | | Diameter of strand | Number of strands | Effective cross sectional area of coil | form of coil |
|---|---|---|---|---|---|
| Curve 60 | Solid wire | 3a | 1 | 9S | All same form (shown in FIG. 13) |
| Curve 61 | Conventional litz wire | a | 9 | 9S | |
| Curve 62 | Litz wire according to the invention | a | 9 | 9S | |

A curve 62 in FIG. 14 shows the case where a litz wire according to the present invention is employed, and indicates a frequency characteristic of a coil which is shown in FIG. 13 and is formed of a litz wire having the cross section shown in FIG. 8A. A curve 61 shows the case where a conventional litz wire is employed, and indicates a frequency characteristic of a coil which is shown in FIG. 13 and is formed of a litz wire having the cross section shown in FIG. 12. A curve 60 indicates a frequency characteristic of a coil which is formed of a solid wire having a diameter of 3*a* and a cross sectional area of 9S.

As is apparent from FIG. 14, when the litz wire 62 according to the present invention is employed, a ratio of high frequency resistance R to d.c. resistance $R_o$ rises at a higher frequency as compared with the ratio $R/R_o$ in the conventional litz wire 61. That is, according to the present invention, a frequency at which the skin depth becomes comparable to the diameter of the strand and therefore the loss resistance increases rapidly, is made higher. Thus, the present invention can exhibit a remarkable effect.

As has been explained in detail in the foregoing, according to the present invention, strands making up a litz wire are made equal in structural arrangement to each other, and therefore an increase in the loss resistance of a single litz wire or coil due to the skin effect can be remarkably suppressed. As a result, a coil to be driven at high speed, for example, a coil used in a magnetic bubble memory can be operated with a low loss. Thus, the present invention has a high industrial value.

Now, explanation will be made on FIG. 2E, for example, for variations of the axial members 9, 12, 15, 18, 21, 31, 33, 40, 41 and 42 shown in FIGS. 2B, 2C, 2D, 2E, 2F, 8B, 8C, 9B, 9C and 9D.

In a coil used in such a device as a magnetic bubble memory, it is desirable from the standpoint of safety to detect the temperature or magnetic field of the coil, and to control the device on the basis of a detected value. According to the present invention, the above-mentioned axial member passes through a central part of the winding of the coil, and therefore can be used effectively to detect the temperature or magnetic field of the coil. That is, when the axial member is formed of a wire which includes a conductor 18*a* at its central portion as shown in FIG. 2E and includes an insulating layer and a thermoplastic resin layer 18*b* at its circumferential portion, the conductor 18*a* can be used as a control signal line.

Now, the temperature detection will be explained, by way of an example. It is well known that the resistance of a conductor varies a little with temperature. Accordingly, the temperature of the coil can be detected in such a manner that a current is forced to flow through the control signal line at an interval and a change in resistance due to a temperature change is detected in the form of, for example, a change in voltage. The temperature detection is utilized in various manner. For example, when the temperature of the coil has reached a predetermined value, the operation of the magnetic bubble memory is stopped for safety.

We claim:

1. In a litz wire for conducting high frequency current comprising a plurality of insulated strands which are twisted to form said wire, each of said strands consisting essentially of an inner conductor and an outer insulating layer on said conductor, the improvement comprising said wire being formed of three of said insulated strands which are twisted in such a manner that said strands are arranged concentrically in said litz wire whereby the loss resistance of the litz wire due to the skin effect when a high frequency current is conducted by said litz wire is greatly reduced.

2. In a litz wire for conducting high frequency current comprising a plurality of insulated strands which are twisted to form said wire, each of said strands consisting essentially of an inner conductor and an outer insulating layer on said conductor, the improvement comprising said wire being formed of three of said insulated strands which are twisted to form a fundamental unit wire of said litz wire, said three insulated strands being twisted in such a manner that said strands are arranged concentrically in said fundamental unit wire, and wherein a plurality of said fundamental unit wires are twisted to form said litz wire, said fundamental unit wires being twisted in such a manner that said fundamental unit wires are arranged concentrically in said litz wire.

3. A litz wire for high frequency current according to claim 2, wherein said plurality of fundamental unit wires are twisted around an axial member.

4. A litz wire for high frequency current according to claim 3, wherein a peripheral portion of said axial member is formed of an insulating layer and a central portion of said axial member is formed of a conductor for conducting a control signal instead of said high frequency current.

5. A litz wire for high frequency current according to claim 4, wherein an adhesive layer is provided at an outermost portion of said insulating layer of said axial member.

6. In a litz wire for conducting high frequency current comprising a plurality of insulating strands which are twisted to form said wire, each of said strands consisting essentially of an inner conductor and an outer insulating layer on said conductor, the improvement comprising said wire being formed by twisting said strands about an insulated axial member disposed along a center line of the litz wire with each of the strands being arranged concentrically in said litz wire and the number of said strands in said litz wire being at least four.

7. In a litz wire for conducting high frequency current comprising a plurality of insulated strands which are twisted to form said wire, each of said strands consisting essentially of an inner conductor and an outer insulating layer on said conductor, the improvement comprising said wire being formed of at least four of said insulated strands which are twisted around an insulated axial member to form a fundamental unit wire where said insulated axial member is disposed along a center line of said fundamental unit wire, said at least four insulated strands being twisted in such a manner that said strands are arranged concentrically in said fundamental unit wire, and wherein at least three fundamental unit wires are further twisted to form said litz wire, said fundamental unit wires being twisted in such a manner that said fundamental unit wires are arranged concentrically in said litz wire.

8. A litz wire for high frequency current according to claim 7, wherein said fundamental unit wires are twisted around a second axial member.

9. A litz wire for high frequency current according to any one of claims 6, 7 and 8, wherein a peripheral portion of said axial member is formed of an insulating layer and a central portion of said axial member formed of a conductor for conducting a control signal instead of said high frequency current.

10. A litz wire for high frequency current according to claim 9, wherein an adhesive layer is provided at an outermost portion of said insulating layer of said axial member.

11. In a litz wire for conducting high frequency current comprising a plurality of insulated strands which are twisted to form said wire, each of said strands consisting essentially of an inner conductor and an outer insulating layer on said conductor, the improvement comprising at least one fundamental unit wire of said litz wire formed with at least three of said insulated strands, each of said insulated strands of said fundamental unit wire being concentrically arranged with respect to and twisted about the center line of said fundamental unit wire as seen in cross section whereby the loss resistance of the litz wire due to the skin effect when a high frequency current is conducted by said litz wire is greatly reduced.

12. A litz wire according to claim 11, wherein at least three of said fundamental unit wires are concentrically arranged and twisted with respect to each other to form a composite wire.

13. A litz wire according to claim 12, wherein at least three of said composite wires are concentrically arranged and twisted with respect to each other to form said litz wire.

* * * * *